(12) United States Patent
Ye et al.

(10) Patent No.: US 9,514,950 B2
(45) Date of Patent: Dec. 6, 2016

(54) METHODS FOR UNIFORM IMPRINT PATTERN TRANSFER OF SUB-20 NM FEATURES

(71) Applicants: Canon Nanotechnologies, Inc., Austin, TX (US); Molecular Imprints, Inc., Austin, TX (US)

(72) Inventors: Zhengmao Ye, Austin, TX (US); Dwayne L. LaBrake, Cedar Park, TX (US)

(73) Assignees: Canon Nanotechnologies, Inc., Austin, TX (US); Molecular Imprints, Inc., Austin, TX (US)

( * ) Notice: Subject to any disclaimer, the term of this patent is extended or adjusted under 35 U.S.C. 154(b) by 0 days.

(21) Appl. No.: 14/585,247

(22) Filed: Dec. 30, 2014

(65) Prior Publication Data

US 2015/0187590 A1   Jul. 2, 2015

Related U.S. Application Data

(60) Provisional application No. 61/921,647, filed on Dec. 30, 2013.

(51) Int. Cl.
*H01L 21/308* (2006.01)
*H01L 21/311* (2006.01)
*H01L 21/02* (2006.01)
*H01L 21/3205* (2006.01)
*H01L 21/3105* (2006.01)
*H01L 21/283* (2006.01)
*G03F 7/00* (2006.01)

(52) U.S. Cl.
CPC ......... *H01L 21/3086* (2013.01); *G03F 7/0002* (2013.01); *H01L 21/02532* (2013.01); *H01L 21/02623* (2013.01); *H01L 21/283* (2013.01); *H01L 21/31058* (2013.01); *H01L 21/31133* (2013.01); *H01L 21/31144* (2013.01); *H01L 21/32051* (2013.01)

(58) Field of Classification Search
CPC .......... H01L 21/3086; H01L 21/32051; H01L 21/283; H01L 21/02532; H01L 21/31133; H01L 21/31058; H01L 21/02623; H01L 21/31144; G03F 7/0002
See application file for complete search history.

(56) References Cited

U.S. PATENT DOCUMENTS 6,873,087 B1   3/2005   Choi et al.
6,932,934 B2   8/2005   Choi et al.
(Continued)

FOREIGN PATENT DOCUMENTS

WO   WO 2011/021573 A1   2/2011

*Primary Examiner* — John P Dulka
*Assistant Examiner* — Charles R Peters
(74) *Attorney, Agent, or Firm* — Cameron A. King

(57) ABSTRACT

Methods of increasing etch selectivity in imprint lithography are described which employ material deposition techniques that impart a unique morphology to the multi-layer material stacks, thereby enhancing etch process window and improving etch selectivity. For example, etch selectivity of 50:1 or more between patterned resist layer and deposited metals, metalloids, or non-organic oxides can be achieved, which greatly preserves the pattern feature height prior to the etch process that transfers the pattern into the substrate, allowing for sub-20 nm pattern transfer at high fidelity.

20 Claims, 6 Drawing Sheets

(56) References Cited

U.S. PATENT DOCUMENTS

| | | | |
|---|---|---|---|
| 6,936,194 B2 | 8/2005 | Watts | |
| 7,077,992 B2 | 7/2006 | Sreenivasan et al. | |
| 7,157,036 B2 | 1/2007 | Choi et al. | |
| 7,179,396 B2 | 2/2007 | Sreenivasan | |
| 7,186,656 B2 | 3/2007 | Sreenivasan | |
| 7,241,395 B2 | 7/2007 | Sreenivasan et al. | |
| 7,256,131 B2 | 8/2007 | LaBrake | |
| 7,396,475 B2 | 7/2008 | Sreenivasan | |
| 7,960,090 B2 * | 6/2011 | Terasaki | B82Y 10/00 430/270.1 |
| 8,076,386 B2 | 12/2011 | Xu et al. | |
| 8,349,241 B2 | 1/2013 | Sreenivasan et al. | |
| 2004/0065252 A1 | 4/2004 | Sreenivasan et al. | |
| 2004/0211754 A1 | 10/2004 | Sreenivasan | |
| 2006/0063359 A1 | 3/2006 | Stacey et al. | |
| 2006/0144814 A1 * | 7/2006 | Kolesnychenko | B82Y 10/00 216/41 |
| 2007/0017899 A1 * | 1/2007 | LaBrake | H01L 21/0271 216/72 |
| 2007/0298176 A1 * | 12/2007 | DiPietro | B82Y 10/00 427/355 |
| 2009/0166317 A1 * | 7/2009 | Okushima | B82Y 10/00 216/11 |
| 2011/0226735 A1 | 9/2011 | Wuister et al. | |
| 2013/0105438 A1 * | 5/2013 | Zhu | G02B 5/1809 216/24 |

\* cited by examiner

METHODS FOR UNIFORM IMPRINT PATTERN TRANSFER OF SUB-20 NM FEATURES

CROSS-REFERENCE TO RELATED APPLICATION

This application claims the benefit under 35 U.S.C. §119 (e)(1) of U.S. Provisional Application No. 61/921,647 filed Dec. 30, 2013; which is hereby incorporated by reference herein in its entirety.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include photovoltaic cells, biotechnology, optical technology, mechanical systems, and the like.

An exemplary nano-fabrication technique in use today is commonly referred to as imprint lithography. Exemplary imprint lithography processes are described in detail in numerous publications, such as U.S. Pat. No. 8,349,241, U.S. Patent Publication No. 2004/0065252, and U.S. Pat. No. 6,936,194, all of which are hereby incorporated by reference herein in their entirety.

An imprint lithography technique disclosed in each of the aforementioned U.S. patent publication and patents includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

DETAILED DESCRIPTION

Figure 1:
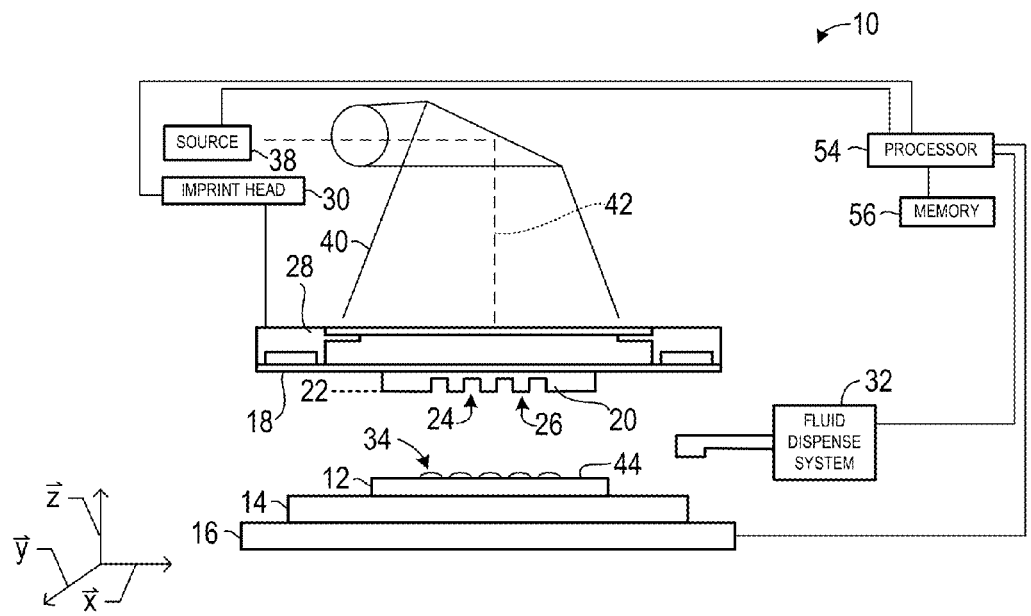
FIG. 1 illustrates a simplified side view of an exemplary imprint lithography system.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide translational and/or rotational motion along the x, y, and z-axes. Stage 16, substrate 12, and substrate chuck 14 may also be positioned on a base (not shown).

Spaced-apart from substrate 12 is template 18. Template 18 may include a body having a first side and a second side with one side having a mesa 20 extending therefrom towards substrate 12. Mesa 20 having a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations (e.g., planar surface). Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electrostatic, electromagnetic, and/or other similar chuck types. Exemplary chucks are further described in U.S. Pat. No. 6,873,087, which is hereby incorporated by reference herein. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit formable material 34 (e.g., polymerizable material) on substrate 12. Formable material 34 may be positioned upon substrate 12 using techniques, such as, drop dispense, spin-coating, dip coating, chemical vapor deposition (CVD), physical vapor deposition (PVD), thin film deposition, thick film deposition, and/or the like. Formable material 34 may be disposed upon substrate 12 before and/or after a desired volume is defined between mold 22 and substrate 12 depending on design considerations. Formable material 34 may be functional nano-particles having use within the bio-domain, solar cell industry, battery industry, and/or other industries requiring a functional nano-particle. For example, formable material 34 may comprise a monomer mixture as described in U.S. Pat. No. 7,157,036 and U.S. Patent Publication No. 2005/0187339, both of which are herein incorporated by reference. Alternatively, formable material 34 may include, but is not limited to, biomaterials (e.g., PEG), solar cell materials (e.g., N-type, P-type materials), and/or the like.

Figure 2:
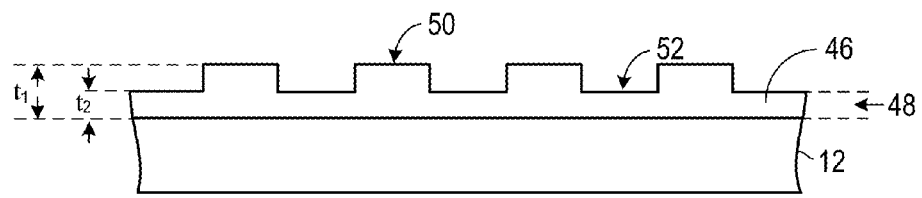
FIG. 2 illustrates a simplified side view of the substrate illustrated in FIG. 1, having a patterned layer with nano-structures thereon.

Referring to FIGS. 1 and 2, system 10 may further comprise energy source 38 coupled to direct energy 40 along path 42. Imprint head 30 and stage 16 may be configured to position template 18 and substrate 12 in superimposition with path 42. System 10 may be regulated by processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by formable material 34. For example, imprint head 30 may apply a force to template 18 such that mold 20 contacts formable material 34. After the desired volume is filled with formable material 34, source 38 produces energy 40, e.g., ultraviolet radiation, causing formable material 34 to solidify and/or cross-link conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having a thickness $t_1$ and residual layer having a thickness $t_2$.

The above-mentioned system and process may be further employed in imprint lithography processes and systems referred to in U.S. Pat. No. 6,932,934, U.S. Pat. No. 7,077,992, U.S. Pat. No. 7,179,396, and U.S. Pat. No. 7,396,475, all of which are hereby incorporated by reference in their entirety.

As previously noted, imprint lithography processes can pattern features as small as 100 nm or less, and have further proven capable of patterning high fidelity features approaching sub-20 nanometers (i.e., less than 20 nm). The ability to imprint such sub-20 nm features has important implications in a number of applications. For example, imprint lithography can be applied in the hard disk drive (HDD) industry to pattern the underlying media with the magnetic cells (or bits) allowing for greater areal density than would otherwise be possible. Currently, high capacity HD disks have storage capacities of up to 0.5 Tbsi (1 terabit (1 trillion bits) per square inch), but to achieve patterned media with desired storage densities of 1 Tbsi and greater, the pattern feature size necessarily needs to be at least 18 nm or smaller, and preferably as small as about 10 nm or even as small as about 5 nm. The semiconductor industry likewise has the need for such small feature (sub-20 nm) patterning, including imprinting parallel lines or gratings for use in e.g. NAND flash memory. However, with decrease in the feature size, the imprint feature height also must also necessarily decrease, given the aspect ratio constraints imposed by imprint lithography (i.e., the smallest of features can be reliably imprinted at an aspect of ratio of at most up to about 3:1, and in certain applications, such as many applications with feature sizes that are <20 nm, the aspect ratio may necessarily be as low as 1.5:1). This leads to a severely limiting reduction in the etch process window necessary to perform accurate pattern transfer into the substrate. For example, to pattern a 5 nm width feature, the imprint feature height is typically around 10~15 nm, up to 5 nm of which is associated with the residual layer. The first step in pattern transfer is residual layer removal. A 10-15 nm overall feature height will typically erode or reduce to 3~8 nm after a 5 nm residual layer etch process. It is extremely difficult to reliably continue the pattern transfer into the substrate with only 3~8 nm remaining resist feature height, as such a height is too small to ensure uniform pattern transfer with reasonable process control and yield for commercial applications.

Alternative reverse tone patterning imprint methods, such as described e.g. in U.S. Pat. Nos. 7,241,395 and 7,186,656, each of which is incorporated by reference in its entirety, can mitigate the effects of feature erosion at larger feature sizes, e.g., 20 nm and above. Such methods typically employ forming a second conformal layer of silicon-containing polymeric resist (e.g. 20% Si-80% polymer) over a first patterned layer of non-silicon-containing organic polymeric resist. The second silicon containing polymeric resist can be formed e.g. by spin coating or imprinting using a no-feature (i.e., blank) template. A blanket etch is performed to etch back the conformal layer to expose protrusions of the patterned layer. A second plasma etch is used to oxidize the silicon-containing polymeric resist while the first patterned layer of non-silicon-containing polymeric resist is removed. By this process, a reverse (or inverse) pattern is created which can then be transferred into the substrate through further etching. However at very small feature heights, the etch selectivity in such methods is at best 3:1 to 4:1 and inadequate to provide high fidelity pattern transfer at the sub-20 nm feature range. This lower selectivity occurs because the organic material in the silicon-containing resist will continue to erode during the etch process even with 100% silicon oxidation. For example, to reliably achieve patterned media with desired storage densities of 1 Tbsi, etch selectivity ideally should approach 7:1 to 8:1. In addition, with certain resist material combinations an intermixing of the first patterned layer of non-silicon-containing polymeric resist and the second conformal layer of silicon-containing polymeric resist was observed. Such intermixing can lead to feature degradation and a significant loss of feature fidelity.

For sub 20 nm pattern transfer, the present invention provides approaches that incorporate particular hard mask materials that increase the selectivity during pattern etch into the substrate. That is, the material selected for use after the imprint process greatly increases etch selectivity during the imprint resist etch process and substrate pattern transfer etch process, as compared to processes using silicon-containing polymeric resist as the hard mask. For example, materials such as Chromium (Cr), Silicon (Si), $Al_2O_3$, and $SiO_2$ erode very slowly in plasma chemistries used to etch organics, and can be applied over an imprinted patterned layer at a low enough temperature. The method of deposition imparts a unique morphology to the multi-layer material stacks (i.e., substrate/patterned resist layer/deposited material layer), which in turn determines the etch process window (e.g. requirement for over etch, etc.) and results in significant improvement in etch selectivity. For example, etch selectivity of 50:1 or more between a patterned organic resist layer and metals, metalloids, or non-organic oxides (e.g. Cr, Si, $Al_2O_3$ and $SiO_2$) can be achieved, which greatly preserves the pattern feature height during the etch process that transfers the pattern into the substrate, allowing for sub 20 nm pattern transfer at high fidelity. In certain aspects of the invention as further described herein, the metal, metalloid, or non-organic oxide (e.g. Cr, Si, $Al_2O_3$ or $SiO_2$) can be deposited according to various techniques, such as gap-fill (e.g., F-CVD), conformal (e.g., atomic layer deposition), small-angle sputter deposition, and various types of CVD processes.

Figure 3A:
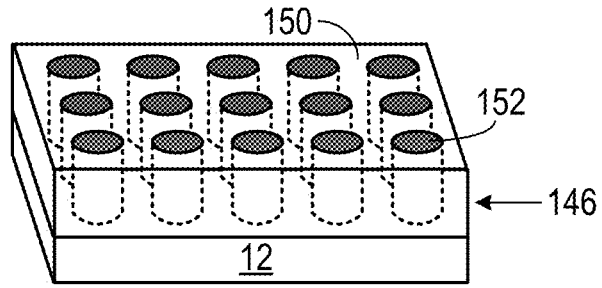
FIGS. 3A-G illustrate a method of patterning a substrate according to an embodiment of the invention.
Figure 3B:
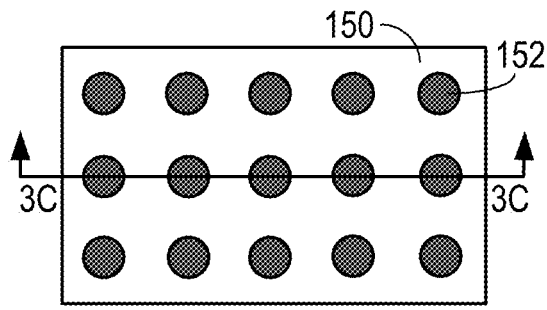
Figure 3C:
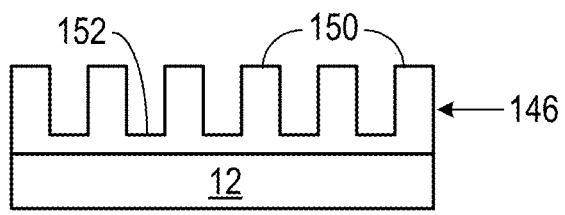

FIGS. 3A-3G depict an exemplary method of the invention. FIGS. 3A-3C illustrate patterned layer 146 formed on substrate 12, with patterned layer 146 containing holes 152 with surrounding, elevated areas (i.e., protrusions) 150. A pillar-tone imprint lithography template (not depicted) is used to form patterned layer 146 from a polymerizable material deposited on substrate 12, according to methods described above with respect to FIGS. 1-2, with the template pillars providing for holes 152 patterned layer 146 of corresponding size and shape. Once patterned layer 146 is formed onto substrate 12, the substrate is subjected to further processing as shown in FIGS. 3D-3G.

Figure 3D:
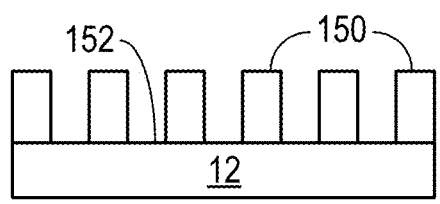
Figure 3E:
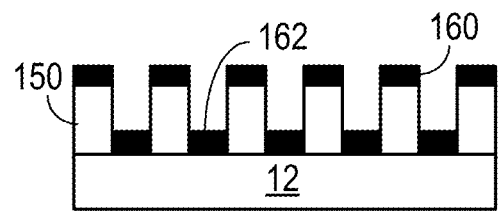

First, patterned layer 146 is subjected to a descum etch to remove residual layer portion at the bottom of each hole 152, such that substrate 12 is exposed at each of holes 152, as depicted in FIG. 3D. Methods for removing residual layer from a patterned layer include, but are not limited to, plasma-based (e.g., oxygen plasma) and vacuum ultraviolet (VUV) etching processes. Such processes are capable of directional (i.e., primarily vertical) etching of the solidified polymerizable material, such that the residual layer is removed with minimal alterations to the lateral dimensions of the holes. The patterned layer is then subjected to a gap-fill deposition process to deposit selected material (e.g. Cr, Si, $Al_2O_3$ or $SiO_2$) onto patterned layer 146 such that it forms deposited layer 162 over exposed substrate 12 at the bottom of holes 152, as shown in FIG. 3E. Exemplary gap-fill deposition processes include, but are not limited to, low temperature FCVD deposition of $SiO_2$.

Figure 3F:
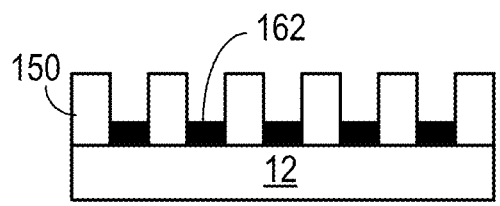
Figure 3G:
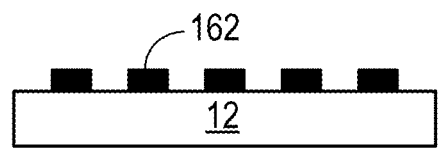

Gap-fill deposition likewise results in some deposition of the selected material on protrusions 150, forming deposited layer 160 over such protrusions. A plasma etch process can be used to remove deposition layer 160 to expose protrusions 150 while leaving deposited layer 162 remaining at the bottom of the holes (as shown in FIG. 3F). Protrusions 150 are then removed by using an oxygen or fluorocarbon based etch process, leaving deposited layer 162, as shown in FIG. 3G. Using deposited layer 162 as a hard mask pattern, substrate 12 is then etched to form pillars (not shown) in substrate 12 corresponding to originally patterned holes 152, followed by removal of remaining deposited layer 162 from the tops of such formed pillars.

Figure 4A:
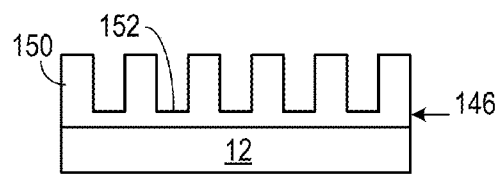
FIGS. 4A-F illustrate a method of patterning a substrate according to another embodiment of the invention.
Figure 4B:
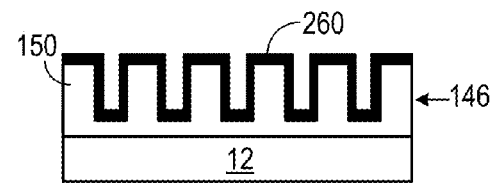

Another exemplary method of the invention is depicted in FIGS. 4A-4E. As above, patterned layer 146 having holes 152 is formed onto substrate 12 (FIG. 4A) and then is likewise subjected to further processing (FIGS. 4B-4E). First, patterned layer 146 is subjected to a conformal deposition process to deposit selected material (e.g. Cr, Si, or $SiO_2$) onto patterned layer 146 such that it forms deposited layer 260 over the entirety of patterned layer 146, as shown in FIG. 4B. Exemplary conformal deposition processes include, but are not limited to, low temperature atomic layer deposition of $SiO_2$ or Al2O3.

Figure 4C:
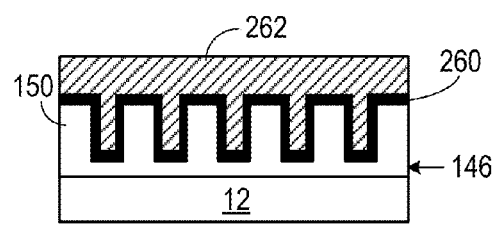
Figure 4D:
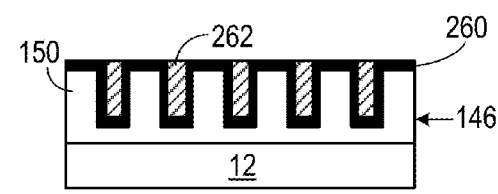
Figure 4E:
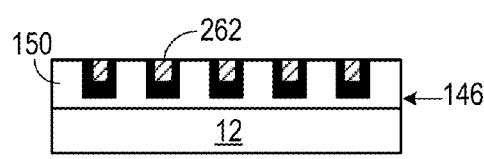
Figure 4F:
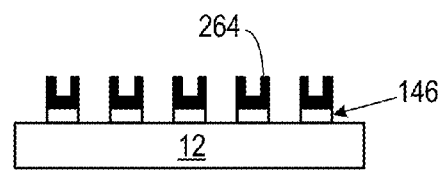

Following the conformal deposition of layer 260 onto patterned layer 146, an additional planarizing layer 262 is formed over layer 260, as shown in FIG. 4C. Planarizing layer 262 can be formed using imprint lithography processes, such as described above, or through other techniques known in the art, such as spin-on or dip planarization processes. Planarizing layer 262 is then etched back to expose deposited layer 260, as shown in FIG. 4D. Portions of deposited layer 260 are then etched back, such that protrusions 150 are exposed while portions 264 of deposited layer 260 remain within holes 250 of patterned layer 146, as shown in FIG. 4E. Protrusions 150 are then removed, leaving portions 264 of deposited layer 260, which correspond to holes 152 of patterned layer 146, remaining, as shown in FIG. 4F. Portions 264 function as a hard mask pattern for etching substrate 12 to form pillars (not shown) in substrate 12. This is followed by removal of remaining portions 264 and patterned layer 146 from the tops of such formed pillars.

Figure 5A:
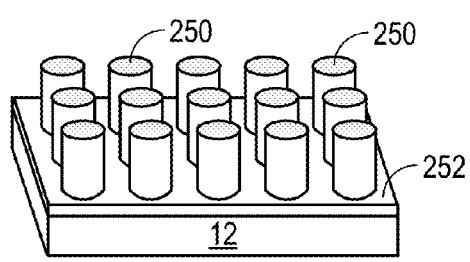
FIGS. 5A-F illustrate a method of patterning a substrate according to yet another embodiment of the invention.
Figure 5B:
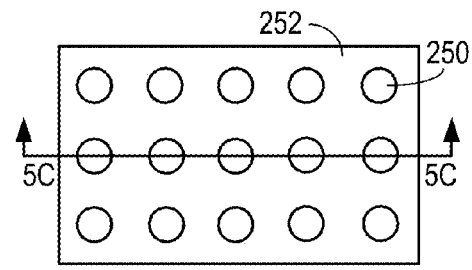
Figure 5C:
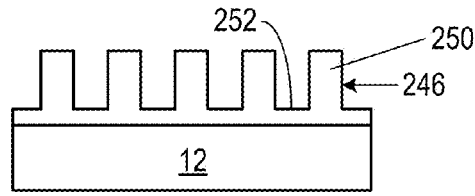
Figure 5D:
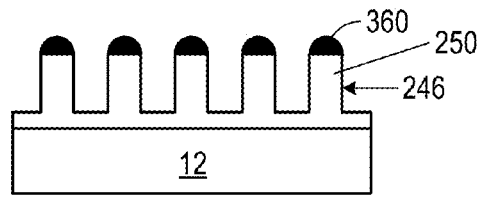
Figure 5E:
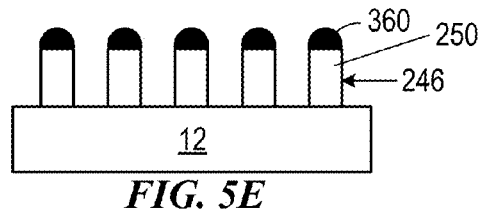
Figure 5F:
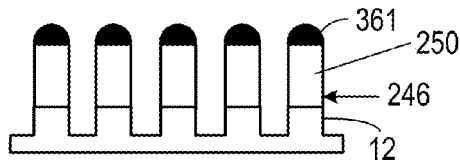

Yet a further exemplary method of the invention is depicted in FIGS. 5A-5F. FIGS. 5A-C illustrate patterned layer 246 formed on substrate 12, in this instance with with patterned layer 246 having pillars 250 extending from surrounding, recessed area 252. A hole-tone imprint lithography template (not depicted) is used to form patterned layer 246 from a polymerizable material deposited on substrate 12, according to methods described above with respect to FIGS. 1-2, with the template holes providing for the formation of pillars 250 of patterned layer 246 of corresponding size and shape. Once patterned layer 246 is formed onto substrate 12, the substrate is subjected to further processing as shown in FIGS. 5D-5F. First, patterned layer 246 is subjected to a small angle deposition of selected material (e.g. Cr, Si, or $SiO_2$) onto patterned layer 246 such that it forms deposited layer 360 capping protrusions 250, as shown in FIG. 5D. In particular, the angle of material deposition is controlled such that the material does not accumulate within recesses 252. Exemplary small angle deposition processes include, but are not limited to, small angle sputtering. Patterned layer 146 is then subjected to a descum etch (e.g., $O_2$ RIE) to remove residual layer portion (recessed area portion 252), such that substrate 12 is exposed over the areas surrounding pillars 250, as depicted in FIG. 5E. Subsequent etching is then done to etch the pattern of pillars into substrate 12.

Figure 6A:
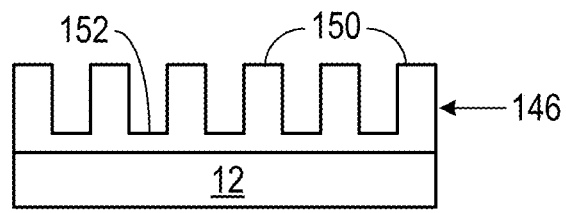
FIGS. 6A-E illustrate a method of patterning a substrate according to further embodiment of the invention.
Figure 6B:
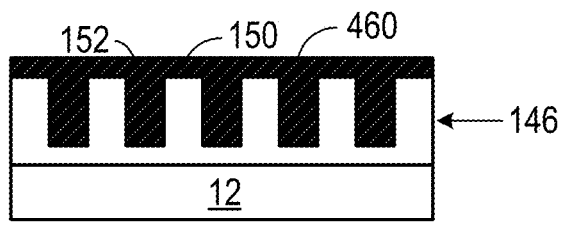
Figure 6C:
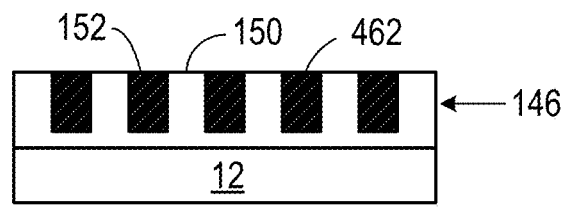
Figure 6D:
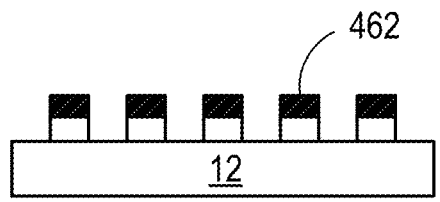
Figure 6E:
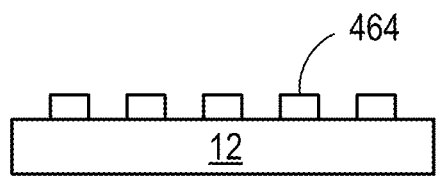

FIGS. 6A-6E depict another exemplary method of the invention. Patterned layer 146 is formed as above with holes 152 formed over substrate 12 (FIG. 6A), as above, followed in this instance by PEVCD deposition of the selected material (e.g. Cr, Si, or $SiO_2$) onto patterned layer 146 such that it forms deposited layer 460 extending over the entirety of patterned layer 146 (FIG. 6B). Deposited layer 460 is thick enough such that it completely fills holes 152 and extends over raised (elevated) area 150. Exemplary PEVCD processes include, but are not limited to, atomic layer deposition and FCVD. Alternately, the deposited layer can be applied by a spin-on process (e.g. SOG). This is followed by etching back deposited layer 460 to expose holes 152 such that portions 462 of deposited layer 460 remain within holes 152 of patterned layer 146, as shown in FIG. 6C. Protrusions 150 are then etched by e.g. using oxygen or helium based process in a plasma etcher leaving portions 462 of deposited layer 460 remaining, which correspond to holes 152 of patterned layer 146, a is as shown in FIG. 6D. Portions 462 function as a hard mask pattern for etching substrate 12 to form pillars (not shown) in substrate 12 corresponding to originally patterned holes 152. This is followed by removal of remaining portions 462 and patterned layer 146 from the tops of such formed pillars.

In further embodiments, the hard mask can consist of more than two materials that have etchants that can achieve high etch selectivity between them. The dual mask layers process can overcome the pattern transfer issue caused by the film surface roughness as a result of certain film deposition techniques.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description. Changes may be made in the elements described herein without departing from the spirit and scope as described in the following claims.

What is claimed is:

1. An imprint lithography method comprising the steps of:
    imprinting a patterned layer of an organic polymerized material on a substrate, the patterned layer having a residual layer and one or more protrusions and recessions defining features of the patterned layer, with the protrusions extending from the residual layer a height of 20 nm or less and having an aspect ratio of 1.5:1 to 3:1;
    depositing an etch selective material onto at least the protrusions and the recessions of the patterned layer, the etch selective material comprising a metal, metalloid or non-organic oxide having an etch selectivity of 50:1 or more relative to the organic polymerized material;
    etching back the deposited etch selective material to reveal the protrusions;
    etching back the protrusions to reveal the substrate; and
    etching the substrate to form an inverse pattern of the patterned layer in the substrate at high fidelity.

2. The method of claim 1 wherein the etch selective material is selected from the group consisting of $SiO_2$, Cr, $Al_2O_3$ or Si.

3. The method of claim 1 wherein depositing the etch selective material further comprises a gap-fill deposition process.

4. The method of claim 1 further comprising etching back the residual layer prior to depositing the etch selective material.

5. The method of claim 1 wherein the depositing the etch selective material further comprises forming a conformal layer of the etch selective material over the patterned layer.

6. The method of claim 5 wherein further comprising completely filling in the recessions with the etch selective material.

7. The method of claim 6 wherein depositing the etch selective material further comprises a spin-on process.

8. The method of claim 5 further comprising forming a planarized layer of polymerized material over the conformal layer and then etching back the planarized layer to expose portions of the conformal layer.

9. The method of claim 1 wherein the recessions define a plurality of holes or wherein the protrusions define a plurality of parallel lines.

10. The method of claim 1 wherein the etch selective material is $Al_2O_3$.

11. An imprint lithography method comprising the steps of:
    imprinting a patterned layer of an organic polymerized material on a substrate, the patterned layer having a residual layer and one or more protrusions and recessions defining features of the patterned layer, with the protrusions extending from the residual layer a height of 20 nm or less and having an aspect ratio of 1.5:1 to 3:1;
    forming a conformal layer of etch selective material over the patterned layer and filling in the recessions of the patterned layer with the etch selective material, the etch selective material comprising a metal, metalloid or non-organic oxide having an etch selectivity of 50:1 or more relative to the organic polymerized material;
    etching back the deposited etch selective material to reveal the protrusions;
    etching back the protrusions to reveal the substrate; and
    etching the substrate to form an inverse pattern of the patterned layer in the substrate at high fidelity.

12. The method of claim 11 wherein the etch selective material is selected from the group consisting of $SiO_2$, Cr, $Al_2O_3$ or Si.

13. The method of claim 11 wherein the etch selective material is $SiO_2$ and wherein the depositing further comprises a spin-on process.

14. The method of claim 11 wherein the recessions define a plurality of holes or wherein the protrusions define a plurality of parallel lines.

15. The method of claim 11 wherein the etch selective material is $Al_2O_3$.

16. An imprint lithography method comprising the steps of:
    imprinting a patterned layer of an organic polymerized material on a substrate, the patterned layer having a residual layer and one or more protrusions and recessions defining features of the patterned layer, with the protrusions extending from the residual layer a height of 20 nm or less and having an aspect ratio of 1.5:1 to 3:1;
    depositing an etch selective material solely on the protrusions of the patterned layer, the etch selective material comprising a metal, metalloid or non-organic oxide having an etch selectivity of 50:1 or more relative to the organic polymerized material;
    etching back the residual layer to reveal the substrate; and
    etching the substrate to form a corresponding pattern of the patterned layer in the substrate at high fidelity.

17. The method of claim 16 wherein the etch selective material is selected from the group consisting of $SiO_2$, Cr, $Al_2O_3$ or Si.

18. The method of claim 16 wherein the depositing the etch selective material further comprises a small-angle deposition process.

19. The method of claim 16 wherein the protrusions define a plurality of pillars or wherein the protrusions define a plurality of parallel lines.

20. The method of claim 16 wherein the etch selective material is $Al_2O_3$.

* * * * *